United States Patent
Ahmad

(10) Patent No.: US 6,194,251 B1
(45) Date of Patent: Feb. 27, 2001

(54) DIE POSITIONING IN INTEGRATED CIRCUIT PACKAGING

(75) Inventor: Syed Sajid Ahmad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/286,555

(22) Filed: Apr. 5, 1999

Related U.S. Application Data

(62) Division of application No. 08/993,237, filed on Dec. 18, 1997, now Pat. No. 5,994,784.

(51) Int. Cl.[7] .......................... H01L 21/44; H01L 21/48; H01L 21/50; H01L 23/22; H01L 23/24
(52) U.S. Cl. .................... 438/127; 438/617; 257/687; 257/784; 257/787
(58) Field of Search ........................... 438/127, 617; 257/687, 784, 795

(56) References Cited

U.S. PATENT DOCUMENTS 5,814,892 * 9/1998 Steidl .................................. 257/784

* cited by examiner

Primary Examiner—Charles Bowers
Assistant Examiner—Nema Berezny
(74) Attorney, Agent, or Firm—Trop, Purner & Hu, P.C.

(57) ABSTRACT

An integrated circuit die or chip may be positioned within an integrated circuit package by providing a spacer connected to the die and extending upwardly therefrom. When the die is overmolded, the spacer contacts the mold and spaces the die with respect to the mold. By forming the spacer using conventional wire bonding techniques, no additional process steps are necessary in forming the spacer and no additional parts are needed. The spacer wire bonds may be formed with wires which extend upwardly above the remaining wires, protecting the remaining wires from being contacted by the mold or from being positioned too close to the upper surface of the resulting molded package.

22 Claims, 2 Drawing Sheets

US 6,194,251 B1

DIE POSITIONING IN INTEGRATED CIRCUIT PACKAGING

This is a divisional of prior application Ser. No. 08/993,237 filed Dec. 18, 1997, now U.S Pat. No. 5,994,784 issued Nov. 30, 1999.

This invention relates generally to packaging integrated circuits and particularly to overmolded integrated circuit packaging.

BACKGROUND OF THE INVENTION

Integrated circuit dice, commonly called integrated circuit chips, are typically mounted inside packages having contacts extending therefrom for communication with the outside world. These contacts may be used to output signals from the chip, to input signals to the chip, or for supplying power or ground connections.

In conventional overmolded technology, a package is formed around the integrated circuit chip which may be mounted on a metal lead frame. The chip may be mechanically connected to the lead frame paddle or to the leads in the case of a lead-on-chip ("LOC") configuration. The chip assembly may also be electrically interconnected by fine wires from chip bond pads to a variety of lead frame fingers which connect to the exterior contacts on the package. The chip assembly is then positioned in a mold and the final package configuration is defined by plastic molding around the chip assembly. Since the lead frame assembly is relatively flexible, the position of the die with respect to the overmolded portion of the package is not necessarily fixed.

Conventionally, the overmolding or encapsulant, which may be a plastic or epoxy, protects and insulates not only the intervening die or chip but the lead frame and the wire bonding wires as well. With a chip assembly in a mold, the encapsulant is injected into the mold and air is exhausted from the opposite end of the mold.

The way the encapsulant enters the mold may cause the die to be displaced, either up or down depending on the lead frame, mold, and package design and on the encapsulation material and process. This may result in package bowing, stress location changes, increased delamination or cracking due to internal stress.

Thus, there is a need for techniques which help to maintain the die centered in overmolded packaging.

SUMMARY OF THE INVENTION

In accordance with one aspect of the present invention, a packaged integrated circuit device includes a die and a plurality of leads. First bond wires are connected between the leads and the die for electrical communication. A second wire bond wire extends vertically over the die above the height of the first wire bond wires. The second wire bond wire is electrically nonfunctional.

In accordance with another aspect of the present invention, an integrated circuit package includes a die assembly including a die and a plurality of leads. A spacer extends upwardly from the die assembly to space the die from the overmolding mold.

In accordance with yet another aspect of the present invention, a packaged integrated circuit device includes a die and a plurality of leads. The integrated circuit device has wire bond wires connected between the leads and the die for electrical communication. A spacer, connected to the die, extends upwardly above the die and is arranged to contact a mold utilized for overmolding of the die.

In accordance with yet another aspect of the present invention, a method of forming integrated circuit packages includes the step of wire bonding a die to a plurality of leads. A spacer wire is formed by wire bonding. The spacer wire extends upwardly over the wire bonding between the die and the leads.

In accordance with yet another aspect of the present invention, a method of forming an integrated circuit device includes the step of electrically connecting a die to a plurality of electrical contacts using wire bonding to form a die assembly. The integrated circuit device forms a spacer secured to the die assembly and extending upwardly. A mold contacts the spacer during the course of overmolding the die.

In accordance with still another aspect of the present invention, a method of forming an integrated circuit device includes the step of electrically connecting the die to a plurality of contacts to form a die assembly. The die assembly is placed in a mold. The die assembly is spaced from the mold using a spacer that extends over the die assembly and connects to the die assembly. The die assembly is then overmolded.

In accordance with yet another aspect of the present invention, a method of centering a die during encapsulation includes the step of forming a die assembly. The die assembly is secured to an element and the element is arranged to extend upwardly so as to center the die during encapsulation.

In these ways, the die may be maintained in the desired centered orientation, and the adverse effects of die displacement may be lessened.

DESCRIPTION OF THE PREFERRED EMBODIMENTS

Figure 1:
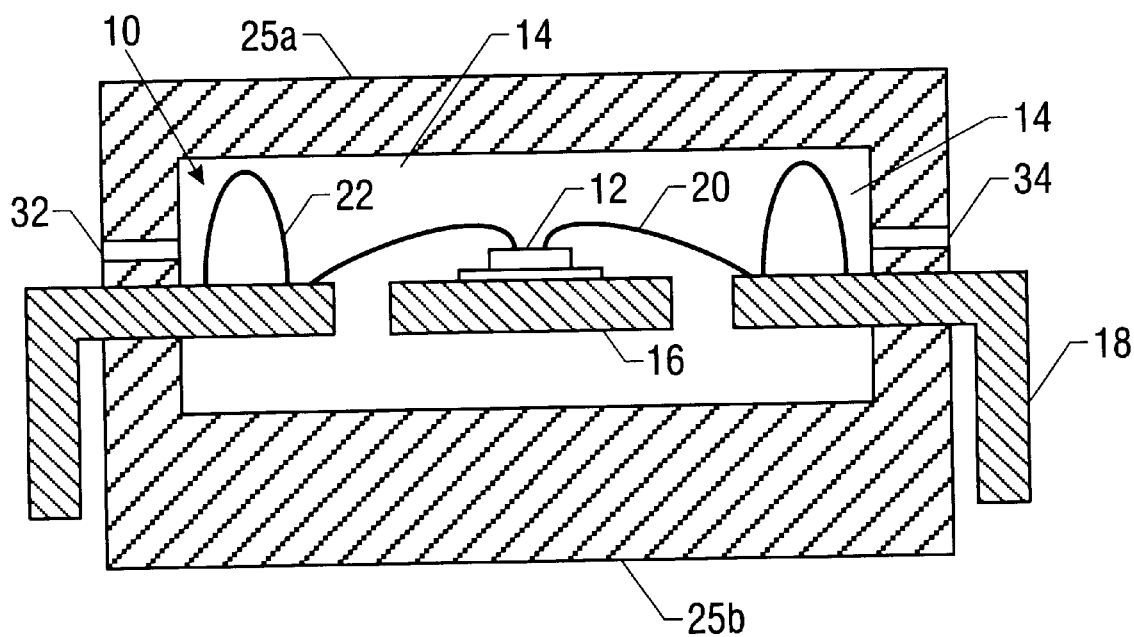
FIG. 1 is a greatly enlarged cross-sectional view showing an integrated circuit package in the course of being overmolded.

Referring to the drawing wherein like reference characters are used for like parts throughout the several views, an integrated circuit assembly 10, shown in FIG. 1, is contained at least in part inside a package mold 25. The mold 25 includes a pair of mold halves 25a and 25b which sealingly press against package leads 18. The mold 25 contains a molding compound 14. The molding compound 14 may be any conventional compound used for overmolding integrated circuit die or chips, including epoxy.

The die 12 may be mounted on a die paddle 16 of conventional design. While a particular form of package is illustrated in FIG. 1, the present invention is amenable to applications with a variety of conventional and advanced packages.

The leads 18 are connected to the die 12 by bonding wires 20. The bonding wires 20 are used for establishing necessary electrical communication between the leads 18 and the die 12. In addition, at least one spacer wire 22 is formed by wire bonding. The spacer wire 22 extends vertically above the bonding wires 20. The wires 20 and 22 are formed in the same process, using conventional wire bonding technology.

While the wires 20 serve electrical functions, the spacer wires 22 are preferably connected so that they do not have any electrical impact. Instead the wires 22 provide a spacing between the mold 25 and the die 12 that insures that the die 12 is centered in the package. Because the wires 22 are connected to the die and extend upwardly therefrom, when the mold 25 contacts the wires 22, which are in turn connected to the die 12, the position of the die within the molded part is determined. In addition, the bonding wires 20 are buried sufficiently within the package to prevent their extension too close to the top of the molding compound 14.

In this way the wires 22 provide an efficient spacing function which does not materially change the manufacturing process. In addition, using the wires 22 does not require additional parts inventory or different processing steps.

Figure 2:
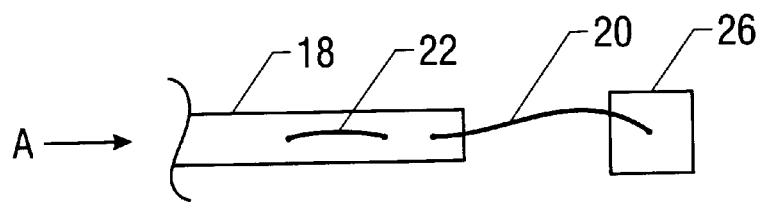
FIG. 2 is a greatly enlarged top plan view of a lead finger and pad connected by the wire bonding wires, as shown in FIG. 1.
Figure 3:
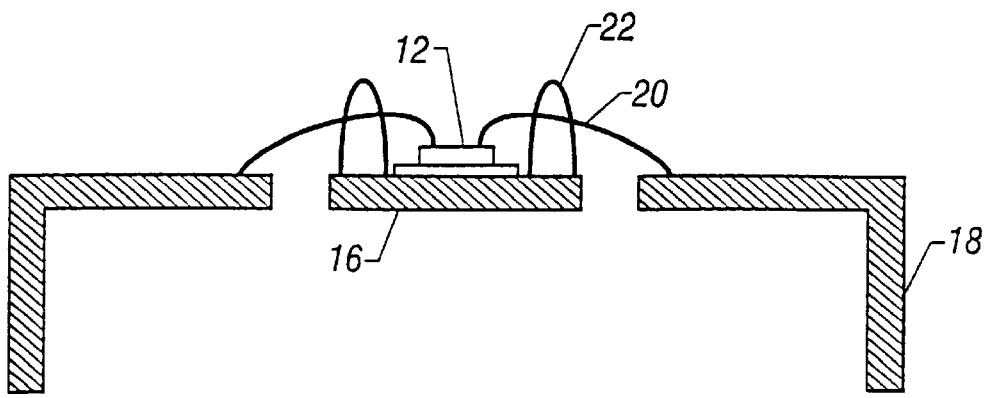
FIG. 3 is a greatly enlarged cross-sectional view of another integrated circuit package.
Figure 4:
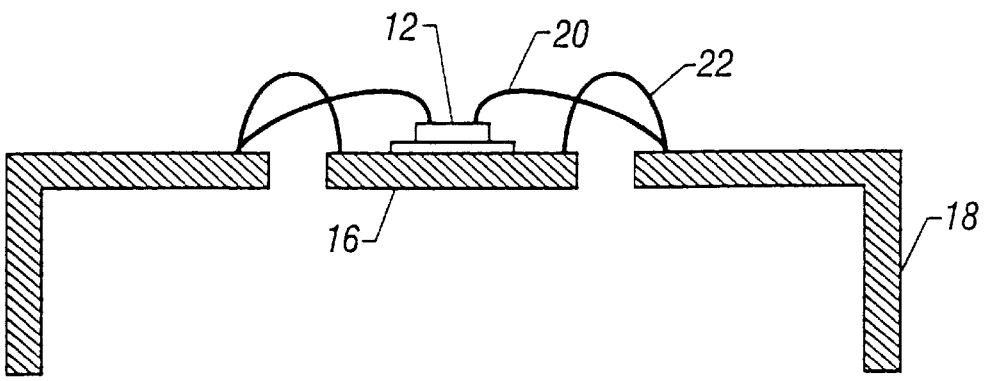
FIG. 4 is a greatly enlarged cross-sectional view of another integrated circuit package.
Figure 5:
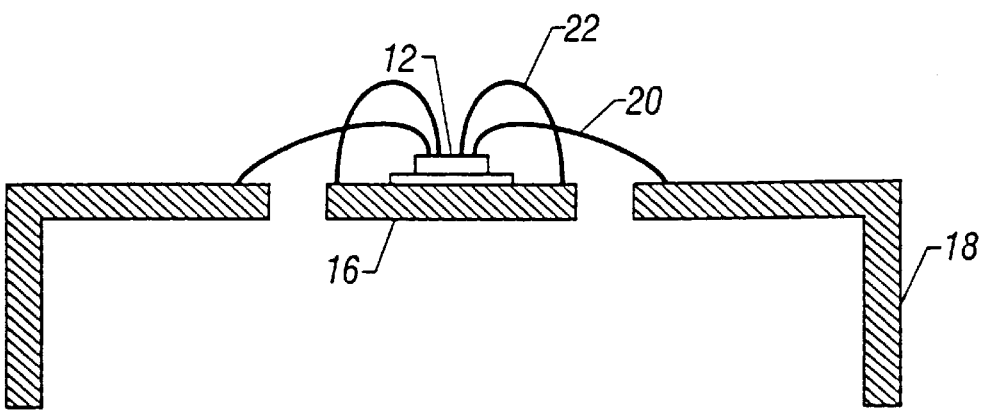
FIG. 5 is a greatly enlarged cross-sectional view of another integrated circuit package.

Referring to FIG. 2, each bonding wire 20 extends from a bond pad 26 to a lead 18. The spacer wires 22 on the other hand may simply connect at two spaced positions to a lead 18 which is also electrically connected by a wire 20 to a die bond pad 26. In addition, the spacer wires 22 could connect to the die paddle 16 at two spaced locations, as shown in FIG. 3, or the wires 22 could extend between a lead 18 and the die paddle 16, as shown in FIG. 4, or the wires 22 could connect between a die pad 28 and the die paddle 16, as shown in FIG. 5. The wire bonds to the bond pads 26 and the leads 18 are the same regardless of whether the wire 20 or 22 is utilized.

Advantageously, the spacer wires 22 are aligned with the encapsulant flow direction indicated by the arrow A in FIG. 2, from inlet 32 to outlet 34, to minimize wire sweep.

In this way the die remains centered in the package without the need for additional components or additional process steps. Ideally, the spacer wires should be sufficient in number to accurately position the die as desired within the package. The number of spacer wires 22 will vary with the application but could be one or several as particular circumstances dictate.

While the present invention has been described with respect to a limited number of preferred embodiments, those skilled in the art will appreciate numerous modifications and variations therefrom. It is intended that the appended claims cover all such modifications and variations as fall within the true spirit and scope of the present invention.

What is claimed is:

1. A method of forming integrated circuit packages comprising:

wire bonding a die to a plurality of leads;

forming a spacer wire by wire bonding, said spacer wire extending upwardly above the wire bonding between the die and said leads; and overmolding said die using a mold and contacting said spacer wire with said mold.

2. The method of claim 1 including the step of bonding said spacer wire only to one of said leads.

3. The method of claim 2 including bonding said spacer wire to one of said leads at two locations.

4. A method of forming an integrated circuit device package comprising:

electrically connecting a die to a plurality of electrical contacts using wire bonding to form a die assembly;

forming a spacer secured to said die assembly and extending upwardly; and overmolding said die using mold and contacting said spacer with said mold during the course of overmolding said die.

5. The method of claim 4 including the step of forming said spacer by wire bonding.

6. A method of forming an integrated circuit device package comprising:

electrically connecting a die to a plurality of contacts to form a die assembly;

placing said die assembly in a mold;

spacing said die assembly from said mold using a spacer extending above said die assembly and connected to said die assembly; and overmolding said die assembly.

7. The method of claim 6 including the step of forming said spacer by wire bonding.

8. The method of claim 7 including bonding said spacer only to one of said contacts.

9. The method of claim 8 including bonding said spacer to one of said contacts at two locations.

10. The method of claim 7 including the step of bonding said spacer to a die paddle at two spaced locations.

11. The method of claim 7 including bonding said spacer to one of said contacts and to a die paddle.

12. The method of claim 7 including the step of bonding said spacer to a bond pad and to a die paddle.

13. The method of claim 6 including the step of aligning the length of said spacer with the direction of molding compound flow in said mold.

14. A method of centering a die during encapsulation comprising the steps of:

forming a die assembly; and securing an element to said die assembly, said element arranged to extend upwardly so as to center the die during encapsulation.

15. The method of claim 14 including the step of forming said element by wire bonding.

16. The method of claim 15 including the step of bonding said element to only one lead.

17. The method of claim 16 including the step of bonding said element to said lead at two locations.

18. The method of claim 15 including the step of bonding said element to a die paddle at two spaced locations.

19. The method of claim 15 including the step of bonding said element to a lead and to a die paddle.

20. The method of claim 15 including the step of bonding said element to a bond pad and to a die paddle.

21. The method of claim 16 including the step of aligning the length of said element with the direction of molding compound flow during encapsulation.

22. A method of forming integrated circuit packages comprising:

wire bonding a die to a plurality of leads;

forming a spacer wire by wire bonding, said spacer wire extending upwardly above the wire bonding between the die and said leads; and bonding said spacer wire only to one of said leads.

* * * * *